United States Patent
Ren

(10) Patent No.: US 8,319,192 B2
(45) Date of Patent: Nov. 27, 2012

(54) CHARGED PARTICLE APPARATUS

(75) Inventor: Weiming Ren, San Jose, CA (US)

(73) Assignee: Hermes Microvision Inc., Hsinchu (TW)

( * ) Notice: Subject to any disclaimer, the term of this patent is extended or adjusted under 35 U.S.C. 154(b) by 294 days.

(21) Appl. No.: 12/862,590

(22) Filed: Aug. 24, 2010

(65) Prior Publication Data

US 2012/0049064 A1 Mar. 1, 2012

(51) Int. Cl.
*H01J 37/145* (2006.01)

(52) U.S. Cl. ............ 250/396 R; 250/310; 250/311; 250/396 ML; 250/492.1; 250/492.3

(58) Field of Classification Search .......... 250/306, 250/307, 310, 311, 396 R, 396 ML, 492.1, 250/492.2, 492.3
See application file for complete search history.

(56) References Cited

U.S. PATENT DOCUMENTS

| | | | | |
|---|---|---|---|---|
| 4,785,176 A | | 11/1988 | Frosien et al. | |
| 4,831,266 A | * | 5/1989 | Frosien et al. | 250/397 |
| 5,847,399 A | * | 12/1998 | Schmitt et al. | 250/396 ML |
| 6,104,034 A | * | 8/2000 | Frosien et al. | 250/396 R |
| 6,194,729 B1 | | 2/2001 | Weimer | |
| 6,498,345 B1 | | 12/2002 | Weimer et al. | |
| 6,614,026 B1 | * | 9/2003 | Adamec | 250/398 |
| 6,855,938 B2 | * | 2/2005 | Preikszas et al. | 250/396 R |
| 6,897,442 B2 | | 5/2005 | Petrov | |
| 7,067,807 B2 | * | 6/2006 | Petrov et al. | 250/307 |
| 7,825,386 B2 | * | 11/2010 | Liu et al. | 250/396 ML |
| 2003/0062478 A1 | * | 4/2003 | Frosien et al. | 250/310 |
| 2008/0006771 A1 | * | 1/2008 | Tseng et al. | 250/307 |
| 2010/0038538 A1 | * | 2/2010 | Drexel | 250/311 |
| 2010/0119698 A1 | * | 5/2010 | Bihr et al. | 427/8 |

\* cited by examiner

*Primary Examiner* — Michael Logie
(74) *Attorney, Agent, or Firm* — Stout, Uxa, Buyan & Mullins, LLP

(57) ABSTRACT

An electromagnetic compound objective lens is provided for charged particle device, especially as an objective lens of low-voltage scanning electron microscope (LVSEM), which comprises a magnetic immersion lens and an electrostatic immersion lens. The magnetic immersion lens orients its gap between an inner pole piece and an outer pole piece to specimen's surface, and uses a magnetic specimen stage. The electrostatic immersion lens comprises three or four electrodes which apply suitable retarding field to a primary beam of the charged particle device for reducing its landing energy on specimen surface and further eliminating imaging aberrations.

23 Claims, 15 Drawing Sheets

CHARGED PARTICLE APPARATUS

BACKGROUND OF THE INVENTION

1. Field of the Invention

The present invention relates to a charged particle apparatus, and more particularly to an immersion electromagnetic compound objective lens for a charged particle apparatus.

2. Description of Related Art

In semiconductor manufacture, pattern defects occur on the mask or wafer during the fabrication process, which reduce the yield to a great degree. Defect inspection, and defect review are widely used for yield management. High spatial resolution, high throughput and low radiation damage on specimen are the major determinants when judging their performance. For the defect inspection and review systems with high spatial resolution, Low-voltage Scanning Electron Microscopy (LVSEM) with Field Emission Source (FES) has been the core technology because of its high spatial resolution and low radiation damage on specimen.

Different from a conventional Scanning Electron Microscope (SEM), in a LVSEM, the examined specimen surface is scanned by a focused low-energy (<5 keV) electron beam or typically called as probe. The low-energy electron irradiation limits the probe/specimen interaction to a very small volume beneath the specimen surface. This feature reduces the radiation damage on the specimen such as pattern shrinkage on wafer resist layer and exit area of excited secondary emission electrons (SE) at the same time. The SE exit area is larger than the incident probe size because some SEs are excited by the backscattered primary electrons at some distance from the incident site. As a result, the ultimate spatial resolution of LVSEM is almost totally defined by the probe spot size.

In a SEM, the probe spot diameter D on specimen surface is determined by the diameter $D_i$ of source geometric image, spherical aberration disc diameter $D_s$, chromatic aberration disc diameter $D_c$, diffraction disc diameter $D_d$, and Coulomb effect disc diameter $D_e$. Their relationships can be simplified to addition in quadrature:

$$D = \sqrt{D_i^2 + D_s^2 + D_c^2 + D_d^2 + D_e^2} \quad (1.1)$$

Each disc diameter is defined as:

$$D_i = M \cdot D_0 \quad (1.2)$$

$$D_S = \frac{1}{4} C_{SA} \cdot \alpha^3 \quad (1.3)$$

$$D_C = \frac{1}{2} \cdot C_{CA} \cdot \alpha \cdot \frac{dV}{V_0} \quad (1.4)$$

$$D_d = 0.61 \cdot \frac{\lambda}{\alpha} \lambda = \frac{12.26}{\sqrt{V_0}} \quad (1.5)$$

$$D_e \propto \frac{1}{V^n} \quad 0 < n < 1 \quad (1.6)$$

Here $C_{SA}$ and $C_{CA}$ are spherical and chromatic aberration coefficients which mostly come from the magnetic objective lens. $V_0$ and $dV$ are electron energy and energy spread. $\alpha$ is beam half angle. All of these dependents are defined at the image plane which is located at the specimen surface. M is imaging system magnification and $D_0$ is virtual source diameter of Field Emission source. $\lambda$ is de Broglie wavelength. V corresponds to the electron energy from source to image plane.

Obviously, the chromatic aberration disc, diffraction disc and Coulomb effect become larger at low energy V. The only way to reduce the diffraction disc is using a bigger half angle, but unfortunately this will increase chromatic aberration disc and spherical aberration disc at the same time. Without Coulomb interaction, the smallest probe spot size is the best balance of these discs (1.2)~(1.5) by appropriately choosing the half angle and the magnification. To further reduce the probe spot size or increase the probe current without increasing the probe spot size, the aberration coefficients must be reduced.

To reduce the Coulomb effect as much as possible, the widely used method is to initially accelerate the electrons to a high kinetic energy and subsequently decelerate the electrons to a desired low final landing energy just prior to impinging onto the specimen, please refer to R. F. W. Pease titled "Low Voltage Scanning Electron Microscopy", Record of the IEEE 9th Annual Symposium on Electron, Ion and Laser Beam Technology, Berkeley, 9-11 may 1967, pp. 176-187, the entire disclosures of which are incorporated herein by reference. The deceleration of electron energy is realized by a retarding field in front of the specimen. Please refer to FIG. 1, a conventional objective lens 130 for LVSEM is shown, in which an excitation coil 132 will provide magnetic field through york 131, and a potential difference between electrode 133 and specimen 170 will provide a retarding field for decelerating a primary beam landing on a specimen 170.

The retarding field may either partially overlap or connect to the magnetic objective field, depending on the deceleration starts inside the magnetic objective, please refer to U.S. Pat. No. 4,785,176 entitled to Juergen Frosien et al. filed Mar. 27, 1987 and entitled "Electrostatic-magnetic Lens for Particle Beam Apparatus", the entire disclosures of which are incorporated herein by reference, or from the rear portion of the magnetic objective, please refer to U.S. Pat. No. 6,194,729 entitled to Eugen Weimer filed Jul. 26, 1998 and entitled "Particle Beam Apparatus", U.S. Pat. No. 6,855,938 entitled to Dirk Preikszas et al. filed Jul. 16, 2003 and entitled "Objective lens for an Electron Microscopy System and Electron Microscopy System", U.S. Pat. No. 6,897,442 entitled to Igor Petrov filed Apr. 25, 2003 and entitled "Objective Lens Arrangement for Use in a Charged Particle Beam Column", U.S. Pat. No. 7,067,807 entitled to Igor Petrov et al. filed Sep. 8, 2004 and entitled "Charged Particle Beam Column and Method of its Operation", and U.S. Pat. No. 6,498,345 entitled to Eugen Weimer et al. filed Jun. 23, 1999 and entitled "Particle Beam Device", the entire disclosures of which are incorporated herein by reference. Both are actually an electromagnetic compound objective. Because the retarding field partially acts like a negative electrostatic lens, it can partially compensate the aberrations of the pure magnetic objective. As a result, the electron deceleration actually provides an effective way to reduce the aberration coefficients as well as Coulomb effects.

For the specimen that can stand a little strong magnetic field such as the wafer or mask inspection, immersing the specimen in a strong magnetic field is much helpful to reduce the aberration coefficients. The magnetic objective with a magnetic circuit gap facing the specimen can provide a strong magnetic field immersion to the larger size specimen. However, such a design will require a larger coil excitation (product of coil turns and coil current), because only a part of the magnetic field located in front of the specimen surface takes part the particle beam focusing. A larger coil excitation incurs heat conduction and cooling issue, and solving this issue increases complexity and instability of the system. Additional publications include U.S. Pat. No. 4,785,176 (Frosien et al.);

U.S. Pat. No. 6,897,442 (Petrov); U.S. Pat. No. 7,067,807 (Petrov et al.); U.S. Pat. No. 6,194,729 (Weimer); U.S. Pat. No. 6,855,938 (Preikszas et al.); U.S. Pat. No. 6,498,345 (Weimer et al.); and "Low Voltage Scanning Electron Microscopy" (R. F. W. Pease, Record of the IEEE 9th Annual Symposium on Electron, Ion and Laser Beam Technology, Berkeley, 9-11 May 1967, pp. 176-187), the entire disclosures of which are incorporated herein by reference.

Accordingly, to realize high spatial resolution and high throughput at the same time in defect inspection and review, an objective lens for LVSEM, which generates smaller aberrations and works at low coil excitation, is needed.

SUMMARY OF THE INVENTION

The object of this invention is to provide an electron beam apparatus employing LVSEM technology. In this apparatus, by specifically arranging the electron deceleration and the overlap of the retarding field and the magnetic objective field, the electromagnetic compound objective lens is designed to have lower aberrations and low coil excitation. So, this invention can provide a higher spatial resolution with a probe current larger than before, which can especially benefit the defect inspection and review in semiconductor yield management.

Accordingly, an electromagnetic compound objective lens is provided, which comprises a magnetic immersion lens including an inner pole piece and an outer pole piece, and an electrostatic immersion lens for electrically screening the magnetic immersion lens from the specimen and providing a retarding field to the primary beam, wherein the inner pole piece and the outer pole piece form a radial magnetic circuit gap facing to the examined surface of a specimen.

The magnetic immersion lens comprises a stage for mounting the specimen, the stage being made of a magnetic material, such that the magnetic field is increased much stronger and its peak is moved closer to the surface of the specimen than the conventional magnetic immersion lens with a radial magnetic circuit gap. The inner pole piece has a first axial distance to the specimen shorter than the outer pole piece, and has a cylinder surface facing to the primary beam.

The electrostatic immersion lens comprises a first electrode inside the inner pole piece, a second electrode under the first electrode and inside the inner pole piece, a third electrode under the second electrode and the inner pole piece of magnetic immersion lens, and a fourth electrode being the specimen and under the third electrode. The first electrode, the second electrode, and the third electrode are round electrodes. The first electrode is at ground potential, and the fourth electrode is at negative potential. The second electrode electrically screens the inner pole piece from the primary beam, and covers the inner pole piece from inside with a first radial gap, and has a second axial distance equal or shorter than the first axial distance. The second electrode is at a potential higher than the third electrode potential. The third electrode electrically screens the inner pole piece from the specimen, and has a flat inner part with an inner diameter equal or smaller than the inner diameter of the inner pole piece, and a conical outer part inlaying to the radial magnetic circuit gap. The third electrode is at a potential higher than the fourth electrode potential, and the potential difference between the third electrode and the fourth electrode is set to ensure the electric field strength over the entire specimen weaker than a permissible value for the specimen safety.

The first electrode has a multi-pole structure and acts as a deflector and/or a stigmator. The second electrode has a multi-pole structure and acts as a deflector and/or a stigmator. The first electrode and the second electrode have a multi-pole structure, and one of the first electrode and the second electrode acts as a deflector and the other acts as a stigmator.

This invention also provides a LVSEM, which comprises an electron gun for providing a primary electron beam, a column for focusing and scanning the primary electron beam on a specimen surface, and a detector for receiving a secondary electron beam, wherein the electron gun includes a cathode, an anode, and a terminal electrode with a gun aperture, and the column includes a condenser for condensing the primary electron beam, a beam limit aperture limiting the current of the primary electron beam, an electromagnetic compound objective lens for focusing the primary electron beam onto the specimen surface, two electrostatic deflectors for scanning the focused primary beam on the specimen surface, and a Wien filter for deflecting a secondary electron beam emitted from the specimen to the detector, wherein the electromagnetic compound objective lens comprises a magnetic immersion lens including an inner pole piece and an outer pole piece, and an electrostatic immersion lens for electrically screening the magnetic immersion lens from the specimen and providing a retarding field to the primary electron beam, wherein the inner pole piece and the outer pole piece form a radial magnetic circuit gap facing to the examined surface of a specimen.

A potential distribution of the low-voltage scanning electron microscope can be the cathode at a fixed potential within −12 kV~-4 kV; the terminal electrode at ground potential; a potential difference between the cathode and the anode being set to generate a virtue source with a desired high brightness; the condenser, and the magnetic immersion lens at ground potential; the first electrode at ground potential; the second electrode at a potential higher than the third electrode potential; the third electrode at a potential higher than the fourth electrode potential; and the fourth electrode at a potential which is 0.2 kV~2.5 kV higher than the cathode potential.

Other advantages of the present invention will become apparent from the following description taken in conjunction with the accompanying drawings wherein are set forth, by way of illustration and example, certain embodiments of the present invention.

DETAILED DESCRIPTION OF EXAMPLE EMBODIMENTS

Figure 1:
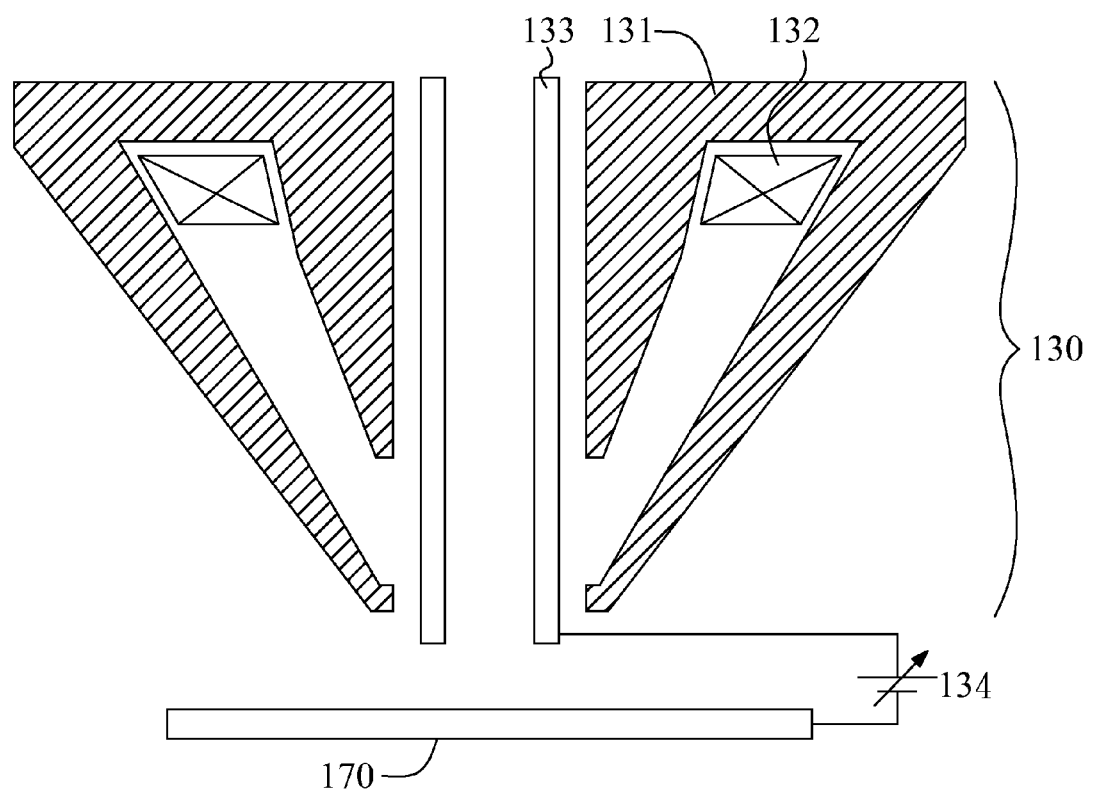
FIG. 1 is a schematic illustration of a conventional electromagnetic compound objective lens.

Various example embodiments of the present invention will now be described more fully with reference to the accompanying drawings in which some example embodiments of the invention are shown. In the drawings, relative dimensions of each component and among every component may be exaggerated for clarity.

Detailed illustrative embodiments of the present invention are disclosed herein. However, specific structural and functional details disclosed herein are merely representative for purposes of describing example embodiments of the present invention. This invention, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

This invention can be applied to an objective lens of any charged particle apparatus or charged beam apparatus, and can be also applied to charged particle apparatus or electron beam apparatus. The embodiments described below will focus on an electron microscope, but the embodiments do not be used to limit this invention to specific electron microscope field.

An electron beam apparatus includes an electron source or typically called as electron gun, an electron imaging and scanning optics, a SE collection device and a specimen stage.

In the electron gun, there are one field emission tip as cathode, one anode, and one terminal electrode with a gun aperture. The cathode and the terminal electrode are respectively fixed at a negative potential Vc such as −12 kV~−4 kV and the ground potential. The anode is at a potential Va which is higher than the cathode Vc. The potential difference Va−Vc is set to generate a virtue source with a desired high brightness for the following imaging and scanning optics or called as the column. The electrons exit from the electron gun and travel through the following column with energy |e·Vc| which is much higher than the landing energy (0.2 keV~2.5 keV) on the specimen. For the case which mostly operates with larger probe current such as defect inspection, Vc needs to be set at a more negative potential such as −8~−12 kV to get a higher electron energy and reduce the Coulomb effects. For the case which mostly operates with moderate or smaller probe current, Vc can be set at a less negative potential such as −4 kV~−8 kV.

The electron imaging and scanning optics mainly includes one magnetic or electrostatic condenser lens, one electromagnetic compound objective lens, one beam limit aperture and two electrostatic deflectors. The condenser and the beam limit aperture together are adjusted to control the incident beam current on specimen or called as probe current and the optimization of the probe spot size. The electromagnetic compound objective lens decelerates the electron energy and focuses the electron beam onto the specimen surface with a desired landing energy. The two electrostatic deflectors together deflect the focused electron beam to scan it on the specimen. The specimen stage is set at the specific negative potential in accordance with the landing energy. Except the electron deceleration part, the column is at ground potential. This avoids the electrical breakdown problem in the column.

The SE collection device includes one Wien filter and an off-axis detector. The Wien filter deflects the SE beam to deviate from the optical axis of the column to land on the off-axis detector, and almost has no effect on the primary electron beam. To get a higher signal gain, the off-axis detector can be set at a potential much higher than the specimen potential to increase SE landing energy. In this case the detector must be covered by an electric screen box at ground potential.

The electromagnetic compound objective lens includes one immersion magnetic objective lens and one immersion electrostatic lens. In the magnetic objective lens, the magnetic circuit gap between the inner pole-piece and the outer pole-piece faces the specimen, i.e. a radial gap, which forms a strong magnetic field immersion of the specimen. The stronger the immersion of the specimen, the lower the aberration coefficients of the imaging will be. If the specimen stage is made of a magnetic material, the magnetic field in the paraxial region becomes stronger, and as a result the coil excitation required to focus the electron beam is reduced. This makes the heat cooling in the magnetic objective lens is not necessary even when using a small working distance.

The immersion electrostatic lens has a four-electrode configuration and takes the space from the rear portion of the magnetic objective bore to the specimen stage. Counting from the gun side to the specimen side, the first electrode is inside the bore of the magnetic objective lens and at the column potential (i.e. ground potential). The second electrode is just inserted into the inner pole-piece from inside and with a small radial gap. The third electrode has a flat inner part located between the inner pole-piece and the specimen, and a conical outer part inlaying into the gap between the inner pole-piece and the outer pole-piece of the magnetic objective lens. The specimen on the specimen stage is as the fourth electrode.

The immersion electrostatic lens will generate a retarding field. The retarding field usually includes negative electrostatic lens fields and positive electrostatic lens fields. The potential arrangement of the four electrodes aims at obtaining negative electrostatic lens fields as strong as possible and suppressing positive electrostatic lens field as much as possible, as well as getting the desired electron landing energy on the specimen. The positive potential difference between the third and fourth electrodes is set to ensure the electrostatic field over the whole specimen surface just a little weaker than the permissible strength for the specimen safety. The potential of the second electrode is adjusted to make the negative electrostatic lens fields in front of the specimen surface as strong as possible. It is well known that the negative electrostatic lens (divergent lens) generates negative aberration coefficients and the positive electrostatic lens (convergent lens) generates positive aberration coefficients. Just due to the existence of the strong negative electrostatic lens fields in front of the specimen surface, the aberration coefficients of the electromagnetic compound objective are reduced to be 10~20% of those of the pure magnetic objective.

Figure 2:
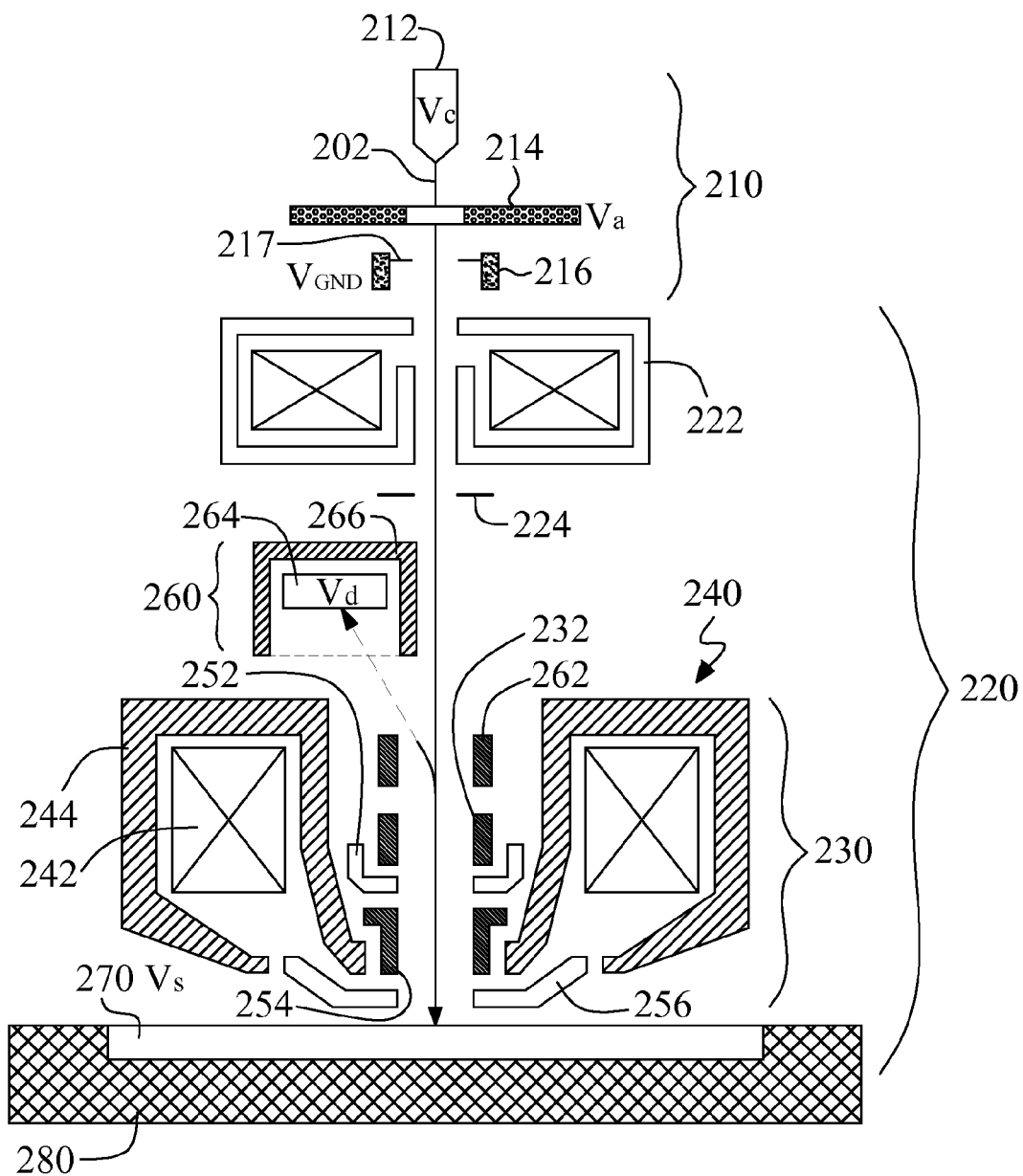
FIG. 2 is a schematic illustration of a particle beam apparatus in accordance with a first embodiment of the present invention.

The following will describe detail structure of an LVSEM and an electromagnetic compound objective lens with referring to drawings. FIG. 2 shows a structure of an embodiment of a LVSEM 200 according to the present invention. When a fixed negative potential Vc and a potential Va which is enough higher than Vc are respectively applied to the field emission cathode 212 and the anode 214, electrons or electron beam 202 are emitted from the cathode 212. The emitted electrons 202 are firstly accelerated in the space between the cathode 212 and anode 214 and then decelerated (accelerated or remain even speed in some cases) in the space between the anode 214 and the terminal electrode 216 at ground potential. The gun aperture 217 cuts off the electrons 202 with larger polar angles, and limits the current of electron beam 202 to a specific value which is a little larger than the desired maximum probe current. Then the electron beam 202 with a fixed energy |e·Vc·|, a fixed brightness and a fixed current will enter the following imaging and deflection system 220. The electron beam 202 is called as primary electron beam or primary beam.

At first the electron beam 202 passes the condenser lens 222 and the beam limit aperture 224. The condenser lens 222 weakly focuses the electron beam 202 to control the current of electron beam 202 after the beam limit aperture 224 to the desired probe current. Then the electron beam 202 passes the Wien filter 262 and No. 1 electrostatic multi-pole lens 232 and No. 2 electrostatic multi-pole lens, in which the No. 2 electrostatic multi-pole lens can be one of the first electrode 252 or the second electrode 254. The Wien filter 262 is designed to not deflect the primary electron beam 202. The two electrostatic multi-pole lenses individually act as a deflector and together deflect the primary electron beam 202 for the scanning on the specimen 270 which is at negative potential Vs.

Next, the deflected primary electron beam 202 enters the electromagnetic compound objective lens 230 which includes the electrostatic immersion lens 250 (252+254+256+270) and the magnetic immersion objective lens 240. The electrostatic immersion lens 250 decelerates (or accelerates then decelerates in some cases) the primary electrons 202 to make them land on the specimen 270 with energy |e·(Vs−Vc)|. The landing energy |e·(Vs−Vc)| is adjusted by changing Vs. The magnetic immersion objective lens 240 best focuses the primary electrons 202 to a small probe spot on the specimen 270 surface. Because focusing the primary beam 202 is mainly accomplished by the magnetic objective lens 240, aberrations of the probe spot most come from the spherical aberration and chromatic aberration of the magnetic objective lens 240.

Figure 3:
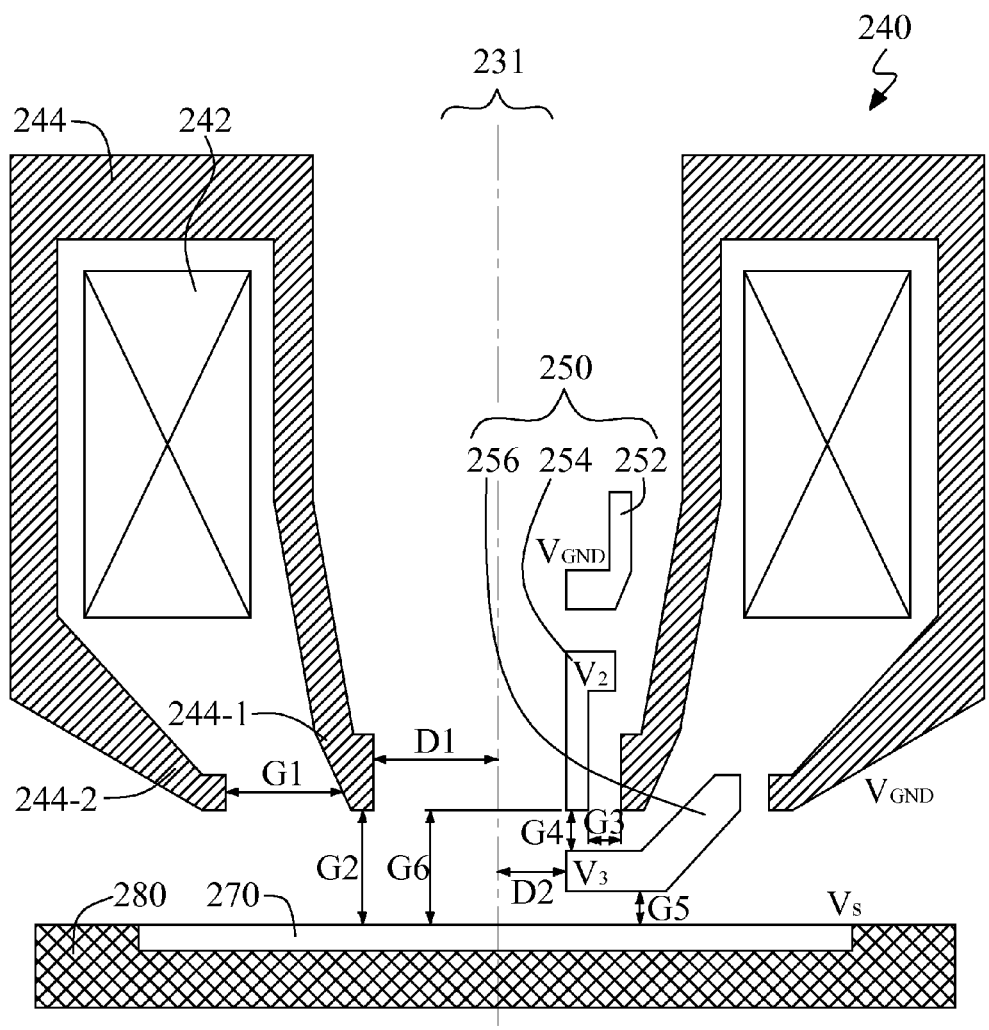
FIG. 3 is a schematic illustration of an electromagnetic compound objective lens in accordance with an embodiment of the present invention.
Figure 4:
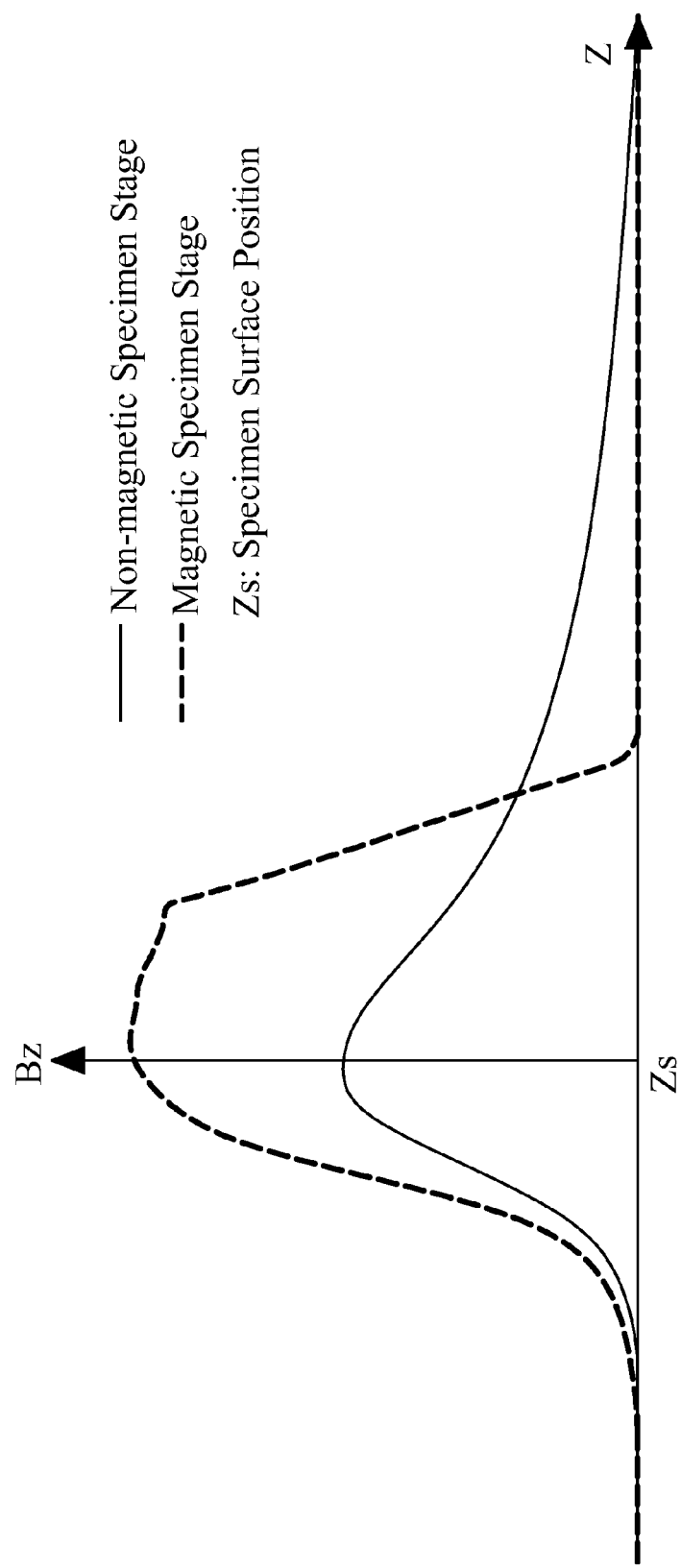
FIG. 4 is a schematic illustration of on-axis distribution of magnetic field generated by the magnetic immersion objective lens in accordance with an embodiment of the present invention.

FIG. 3 shows one embodiment of the electromagnetic compound objective lens 230. In order to explain it clearly, the left half only shows the pure magnetic objective lens 240 structure and the right part shows the whole structure 230. The magnetic objective lens 240, including an excitation coil 242 and a york 244, has a gap G1 between the inner pole-piece 244-1 and outer pole-piece 244-2, which faces the specimen 270. The inner pole-piece 244-1 has a shorter axial distance G2 to the specimen 270 than the outer pole-piece 244-2. Both the inner pole piece 244-1 and outer pole piece 244-2 have a protrusion structure with a flat surface facing to the axis. The specimen stage 280 can be made of either a nonmagnetic or a magnetic material. The on-axis distributions of the magnetic field with same coil excitation in these two cases are shown in FIG. 4. The magnetic stage 280 not only enhances the magnetic field to a great degree but also shifts the peak of the magnetic field towards the specimen 270 surface. The first function reduces the coil excitation required to focus the electron beam 202 on the specimen 270 surface, and consequently reduces the heat generated by the coils 242. The second function a little increases the magnetic field at the specimen 270 surface, and consequently reduces the aberration coefficients to a certain degree.

The electrostatic immersion lens 250 includes four electrodes 252, 254, 256, and 270. Electrodes 252, 254, and 256 are round electrodes, and the fourth electrode 270 is a flat electrode (i.e. specimen 270). The first electrode 252 at ground potential is located at the lower area of the bore 231 of the magnetic objective lens 240. The second electrode 254 at V2 potential covers the inner pole-piece 244-1 from inside with a small radial gap G3, and its axial distance G6 to the specimen 270 is equal or shorter than G2. The third electrode 256 at V3 potential is located between the inner pole-piece 244-1 and the specimen 270 with an axial gap G4 to the inner pole-piece 244-1 and an axial gap G5 to specimen 270. The third electrode 256 has a flat inner part with a inner diameter D2 equal or smaller than the inner diameter D1 of the inner pole-piece 244-1, and a conical outer part inlaying into the gap G1.

Structure and shape of the third electrode 256 and the outer pole piece 244-2 can allow the specimen 270 tilt in an angle in the space or an oblique incidence of a laser beam for measuring axial position of the specimen 270. If both cases are not necessary, such a conical design is not necessary, and the outer pole-piece 244-2 and the third electrode 256 may be flat.

The electromagnetic compound objective lens 230 shown in FIG. 3 makes it possible to realize lower imaging aberrations and weaker Coulomb effects at the same time by putting the magnetic immersion objective lens approaching the specimen 270 as close as possible.

For a magnetic objective lens 240, it is well known that the smaller the focus length, the smaller the aberration coefficients will be. Therefore, it is advantageous to use a small working distance G2 in a radial-gap magnetic objective lens 240. However, in LVSEM, the working distance G2 can not be reduced independently because the existence of the potential difference between the inner pole-piece 244-1 and the specimen 270. This potential difference generates an electric field on the specimen 270 surface, which must be weaker than the permissible limit to avoid the damage on the specimen 270. Hence, this potential difference must be reduced with reduction of the working distance G2. When the whole column 220 is at ground potential for practical reason, reducing this potential difference will imply the energy reduction of the primary electrons 202 passing through the column 220. As a result, the Coulomb effects will be increased.

To avoid the dilemma in FIG. 3, electrodes 254 and 256 are used to isolate the inner pole-piece 244-1 from the specimen 270. In this case, the electric field on specimen 270 is not related to the inner pole-piece 244-1. The outer pole-piece 244-2 almost has no effect on the aberrations, so it can be located a little far away from the specimen 270. Because the electrical breakdown threshold in space (about 5 kV/mm, depends on the vacuum and electrode surface roughness) is much larger than the permissible limit on specimen 270 (about 1.5 kV/mm for a wafer, depends on the specimen material and patterns on specimen surface), the attainable working distance G2 is reduced to a certain degree. Except the part facing the inner hole of 256, the electric field all over the specimen 270 is determined by the potential difference Vs−V3. So V3 will be changed with Vs. The potential V2 applied on electrode 254 is used to adjust the electric field in front of the part of 270 facing the inner hole of 256, which takes a significant role in compensating the magnetic objective aberrations.

Figure 5A:
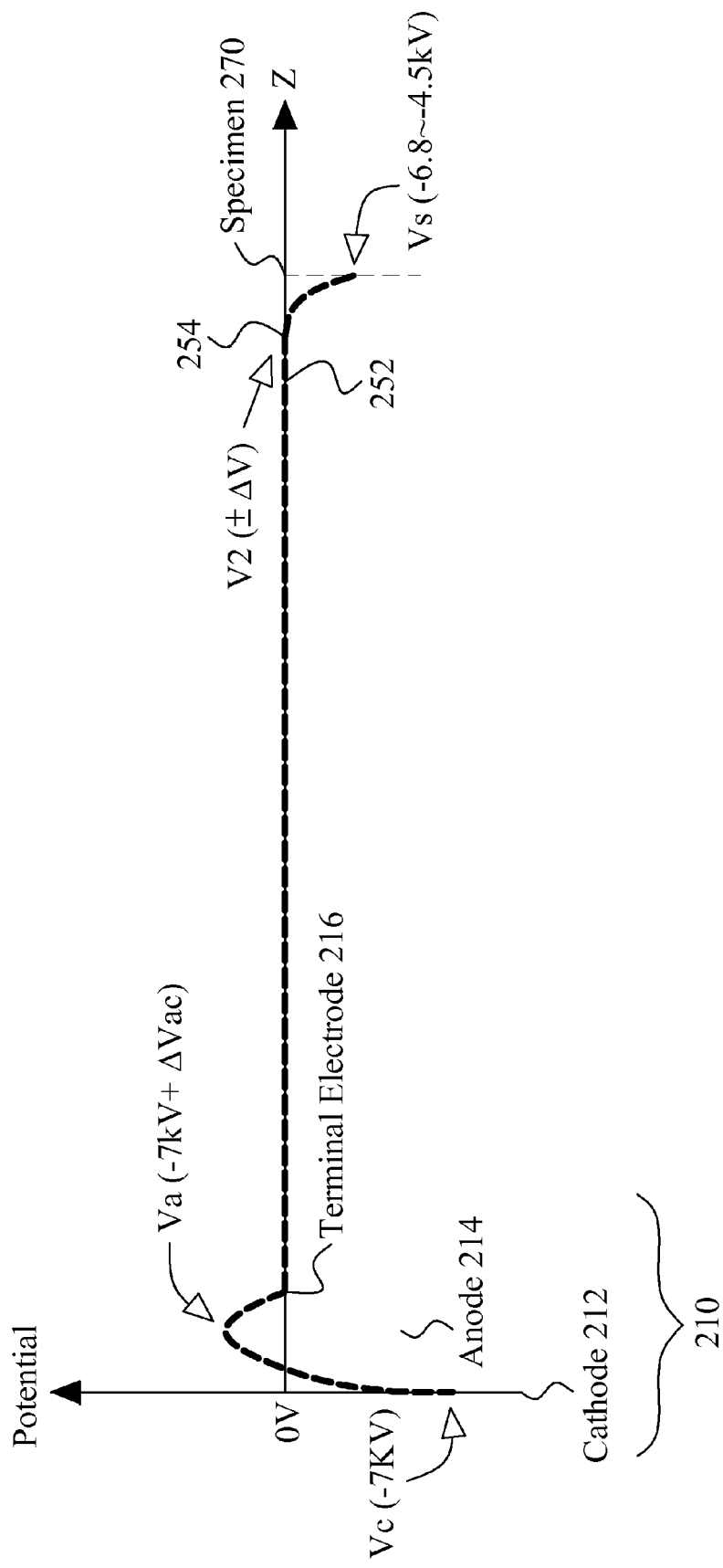
FIG. 5A to FIG. 5C are schematic illustrations of one detail illustration of potential distribution and electron trajectory operated by the particle beam apparatus in FIG. 2 and the electromagnetic compound objective lens in FIG. 3 in accordance with an embodiment of the present invention.
Figure 5B:
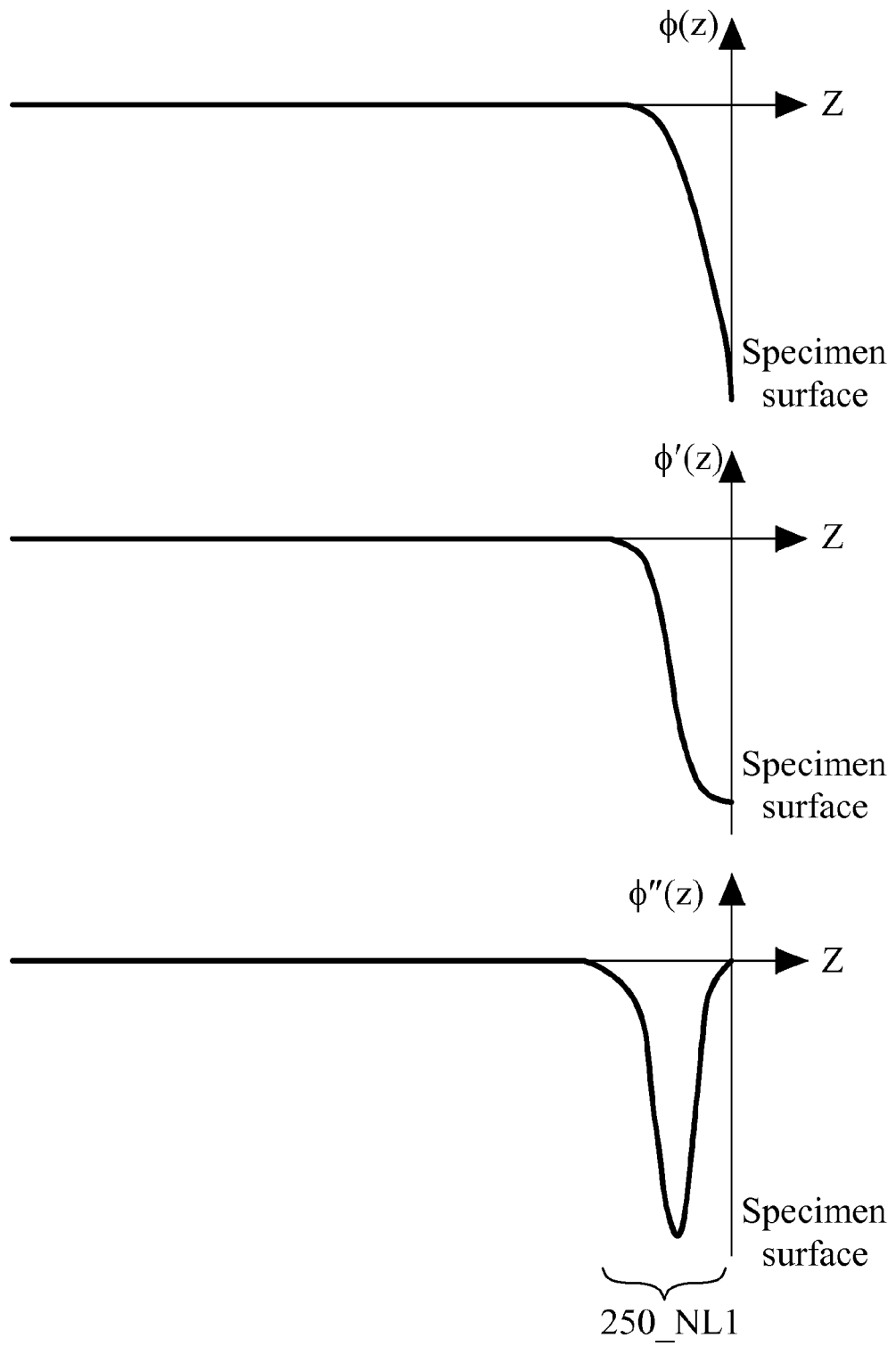
Figure 5C:
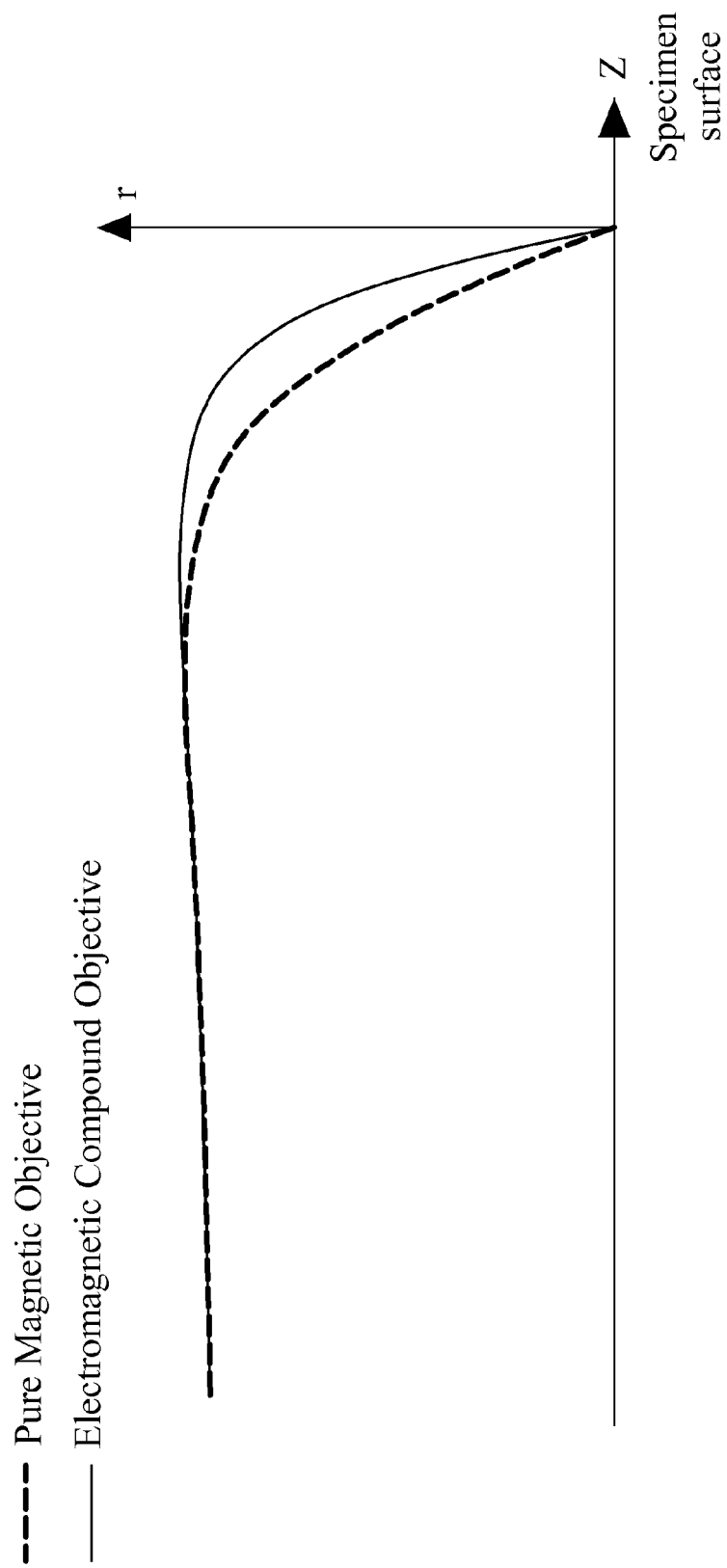

FIG. 5A to FIG. 5C show a detailed on-axis potential distribution and an electron trajectory in FIG. 2 with FIG. 3. Regarding the electron gun 210 in FIG. 5A, the cathode 212 is at −7 kV; the anode 214 is at a positive potential −7 kV+ΔVac; and the terminal electrode 216 is at ground potential. The potential difference ΔVac is set to make the electron beam exit the terminal electrode with a desired high brightness, and form a virtual source near the tip surface of the cathode 212. From the terminal electrode 216 to the 1st electrode 252 of the electrostatic immersion lens 250, the column 220 is at ground potential. So, the electrons 202 pass through the column and enter the electromagnetic compound objective lens 230 with 7 keV energy. The specimen 270 is set at −6.8~−4.5 kV for obtaining 0.2 keV~2.5 keV electron landing energy. The moderate high voltage (<6.8 kV) applied to the specimen 270 and the surrounding electrodes 254 and 256 do not easily arise discharge or damage on the specimen 270. In this case, to get small probe spot size within the landing energy range, the potential V2 of the 2nd electrode 254 is adjusted within a range around the ground potential.

FIG. 5B shows the on-axis distributions of the potential $\phi(z)$, electric field $\phi'(z)$ and $\phi''(z)$ which determines the focusing power of the electrostatic lens. The negative $\phi''(z)$ implies the negative lens 250_NL1 appears. The negative aberration coefficients generated by this negative electrostatic lens compensate the positive aberration coefficients generated by the magnetic objective lens 240, and finally reduce the aberration coefficients to 10~20% of those of pure magnetic objective lens 240. FIG. 5C shows the electron trajectory passing through the objective lens 230 and landing on the specimen 270. Compared to those in the pure magnetic objective lens 240 in FIG. 2, there is an obvious divergent deviation.

Figure 6A:
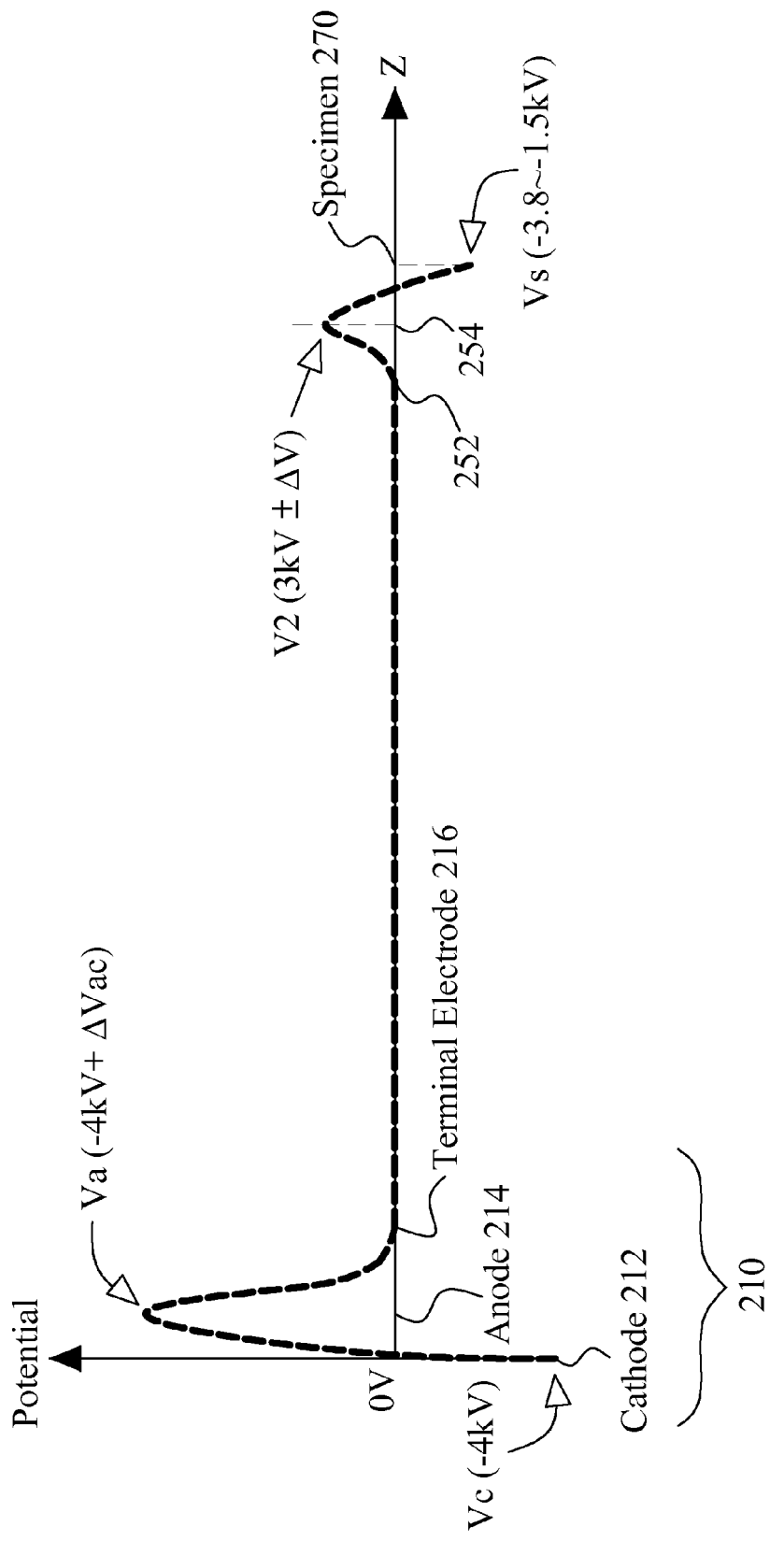
FIG. 6A to FIG. 6C are schematic illustrations of another detail illustration of potential distribution and electron trajectory operated by the particle beam apparatus in FIG. 2 and the electromagnetic compound objective lens in FIG. 3 in accordance with an embodiment of the present invention.
Figure 6B:
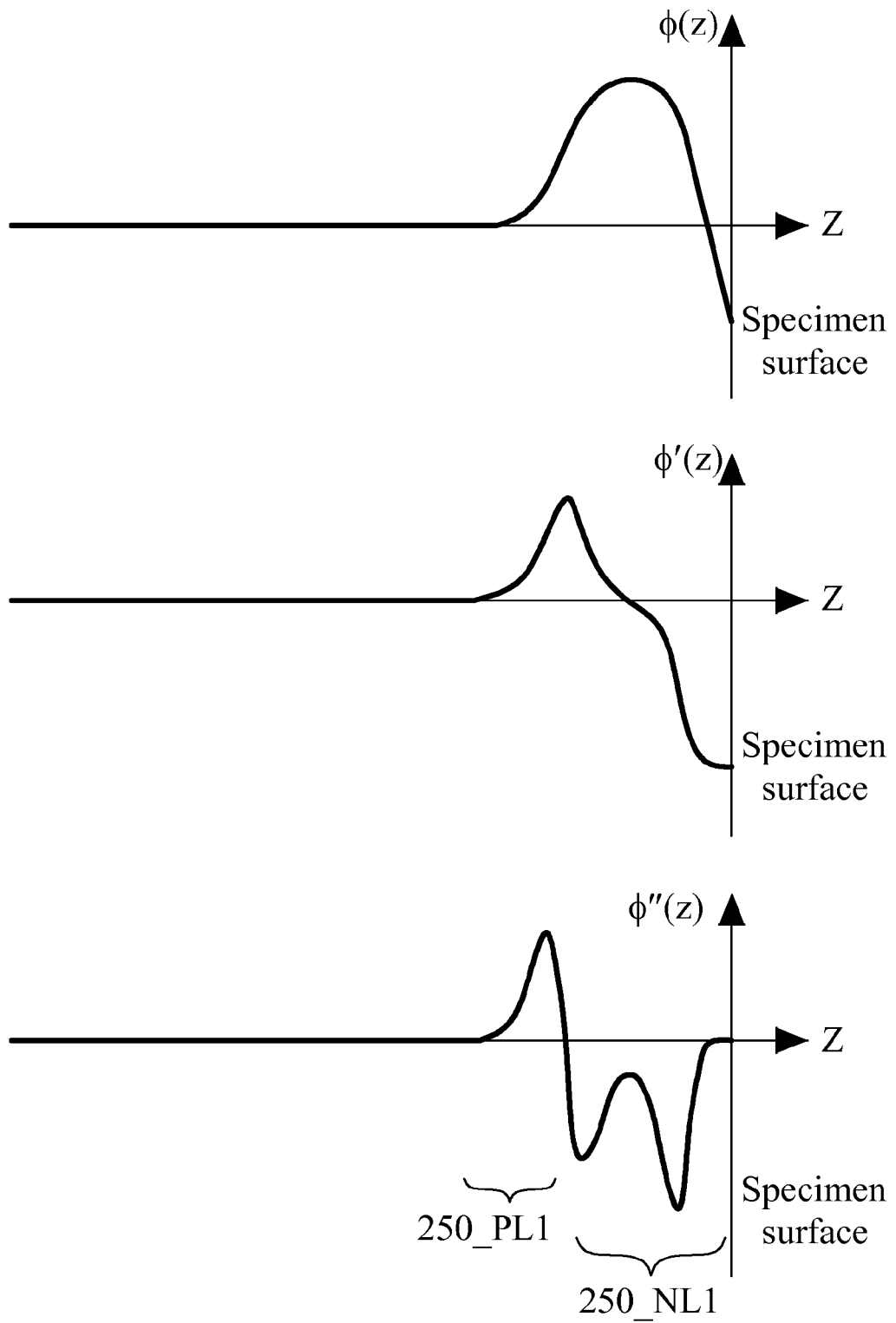
Figure 6C:
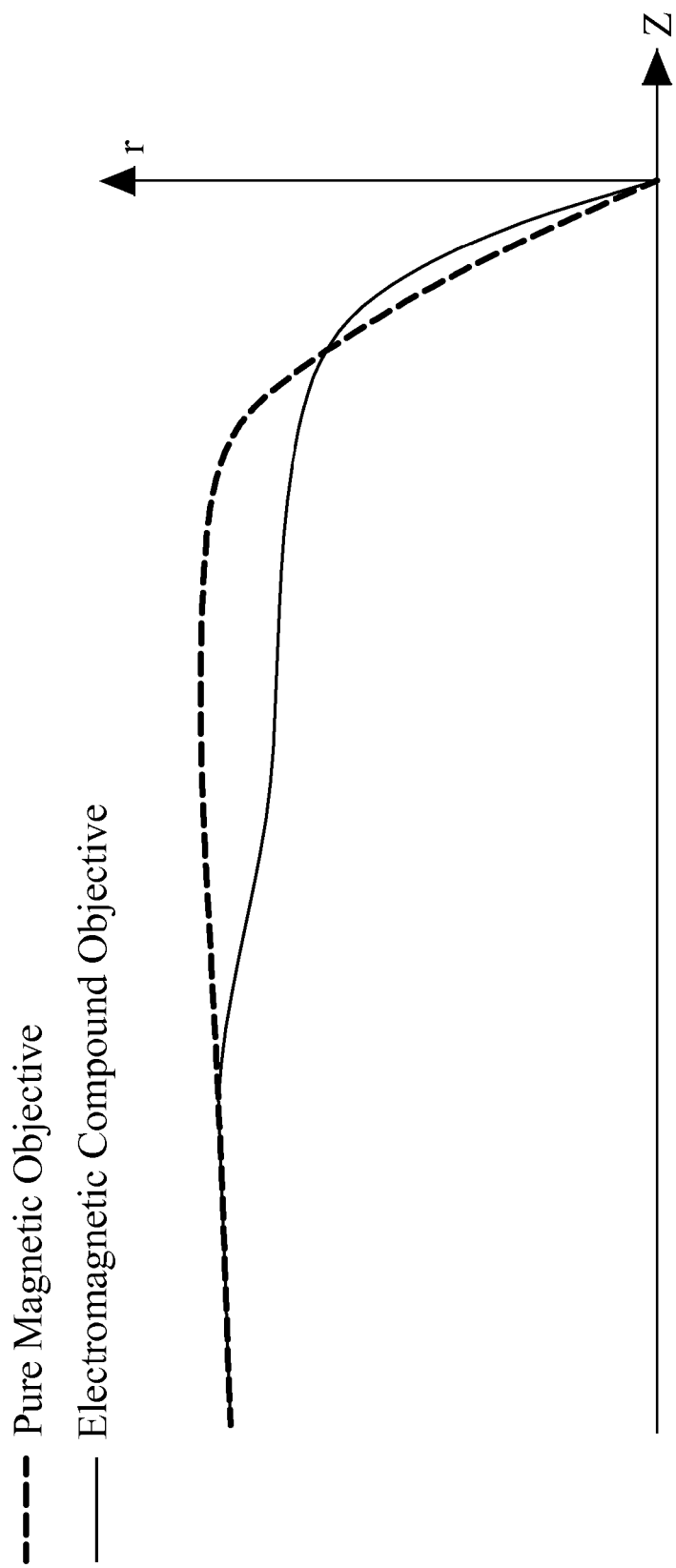

FIG. 6A to FIG. 6C show another detailed on-axis potential distribution and an electron trajectory in FIG. 2 with FIG. 3. In FIG. 6A, the cathode 212 potential Vc is raised to −4 kV, and correspondently the specimen 270 potential Vs at −3.8 kV~−1.5 kV for obtaining 0.2 keV~2.5 keV electron landing energy range. Same as FIG. 5A, the positive potential difference ΔVac between the cathode 212 and the anode 214 is set to make the electron beam 202 exit the terminal electrode 216 with a desired high brightness, and form a virtual source near the tip surface of the cathode 212. From the gun terminal electrode 216 to the 1st electrode 252 of the electrostatic immersion lens 250, the column 220 is at ground potential. The electrons 202 pass through the condenser 222 and enter the electromagnetic compound objective lens 230 with 4 keV energy, so it is suitable for the case which mostly operates with smaller probe current. To get small probe spot size within the landing energy range, the potential V2 of the 2nd electrode 254 is adjusted within a positive potential range around 3 kV. The lower voltage (<3.8 kV) applied to the specimen 270 and the surrounding electrodes 254 and 256 further reduce the possibility of discharge or damage on the specimen 270.

Because of the acceleration between the 1st electrode 252 and the 2nd electrode 254, a weak positive electrostatic lens 250_PL1 appears in front of the strong negative electrostatic lens 250_NL1 in FIG. 6B. On one hand, this positive electrostatic lens 250_PL1 generates an additional positive aberration which is not desired. On the other hand, it focuses the electrons 202 closer to the optical axis which will reduce the aberrations generated by the magnetic objective lens 240. As a result, it almost has the same aberration compensation effect as those shown in FIG. 5A to FIG. 5C. FIG. 6C shows the electron trajectory passing through the objective lens 230 and landing on the specimen 270. Compared to those in the pure magnetic objective 240 in FIG. 2, there is a convergent deviation at first, then a divergent trend.

Figure 7A:
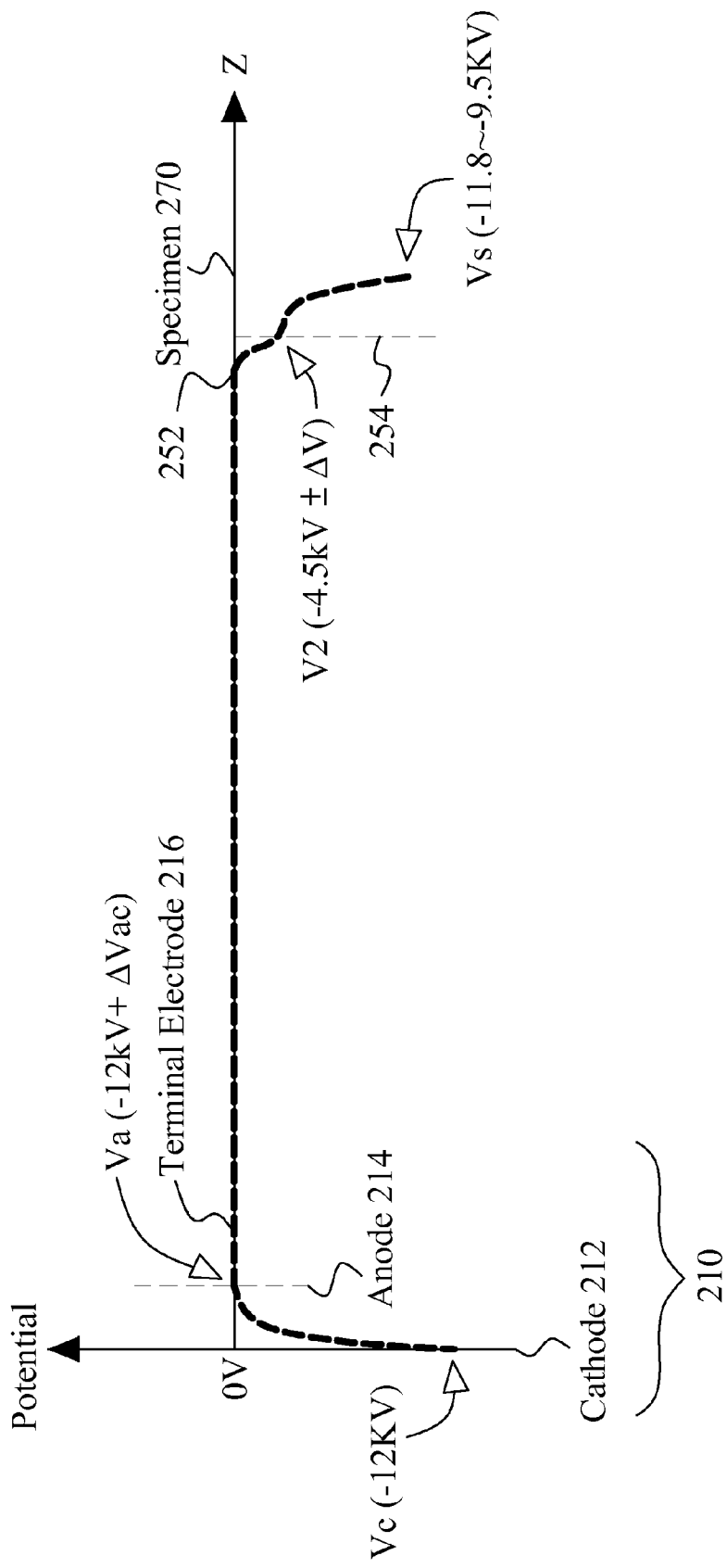
FIG. 7A to FIG. 7C are schematic illustrations of still another detail illustration of potential distribution and electron trajectory operated by the particle beam apparatus in FIG. 2 and the electromagnetic compound objective lens in FIG. 3 in accordance with an embodiment of the present invention.
Figure 7B:
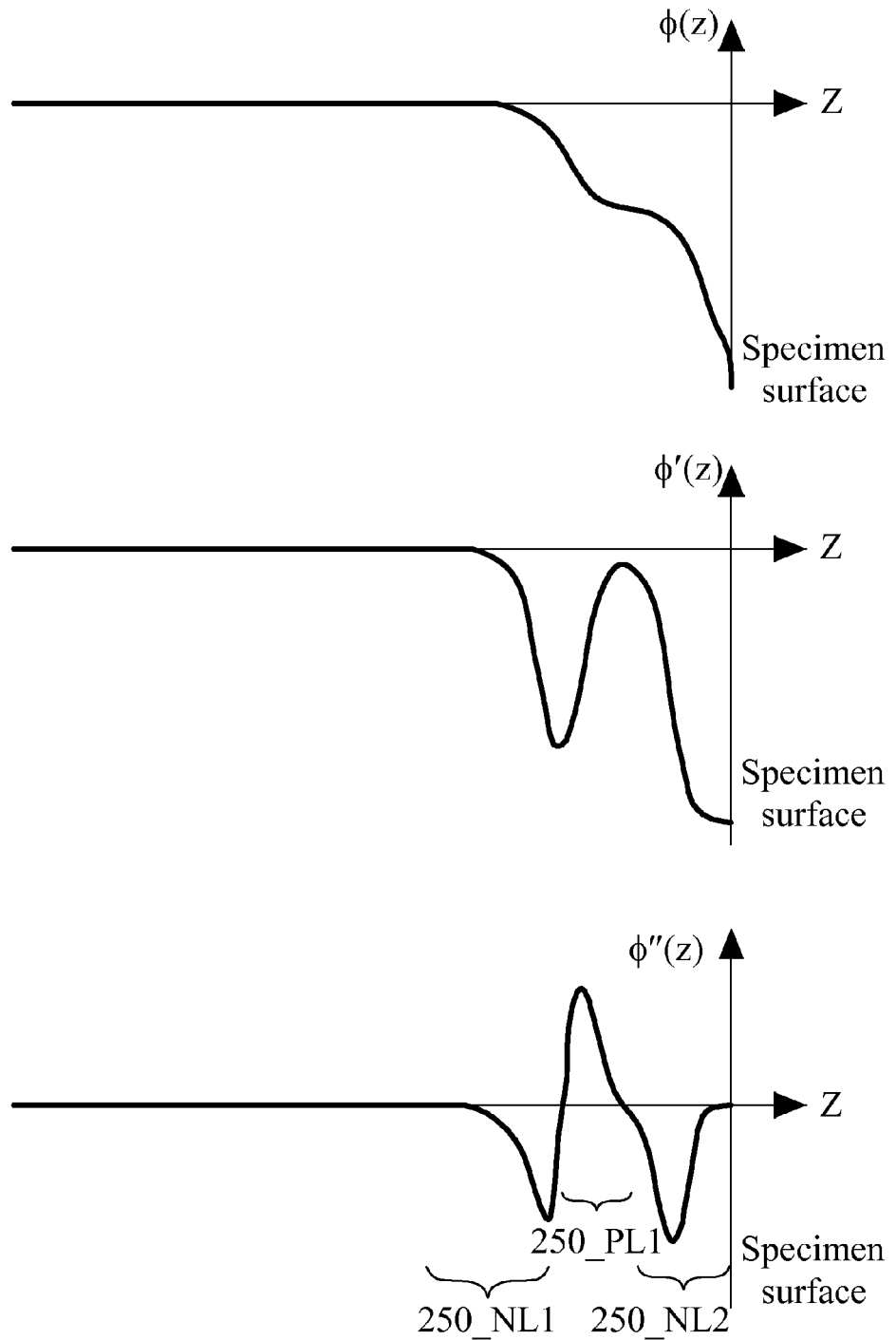
Figure 7C:
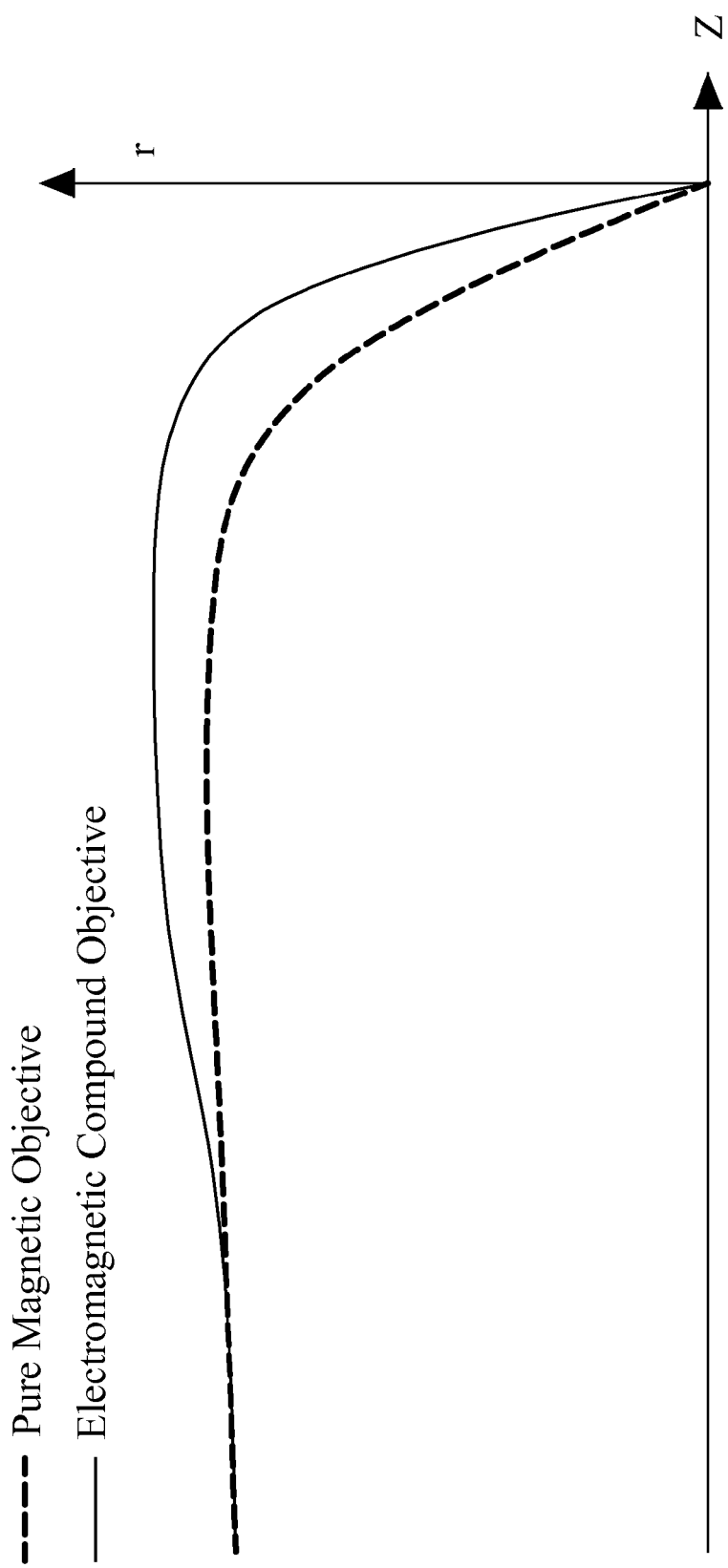

FIG. 7A to FIG. 7C shows another detailed on-axis potential distribution and an electron trajectory in FIG. 2 with FIG. 3. In FIG. 7A, to avoid the stronger Coulomb effect happening when a larger probe current 202 is used, the cathode 212 voltage Vc is lowered to −12 kV. In this way, the electron energy is raised to 12 keV when passing through the column 220 and entering the electromagnetic compound objective lens 230. To get small probe spot size within the landing energy range, the voltage V2 of the 2nd electrode 254 is adjusted within a negative voltage range around −4.5 kV.

To avoid a too strong electric field on specimen 270, the deceleration between the 2nd electrode 254 and the 3rd electrode 256 is adjusted to be slower than those between the electrodes 252 and 254. So, a weak positive electrostatic lens 250_PL1 appears between two negative electrostatic lenses 250_NL1 and 250_NL2 in FIG. 7B. On one hand, this positive electrostatic lens generates an additional positive aberration which is not desired. On the other hand, it focuses the electrons 202 closer to the optical axis which will reduce the aberrations generated by the magnetic objective lens 240. As a result, it almost has the same aberration compensation effect as those shown in FIG. 5A to FIG. 5C. FIG. 7C shows the electron trajectory passing through the objective lens 230 and landing on the specimen 270. Compared to those in the pure magnetic objective lens 240 in FIG. 2, there is a divergent deviation at first, then a convergent trend.

In the electrostatic immersion objective lens 250 shown in FIG. 3, one or both of the 1st electrode 252 and the 2nd electrode 254 have a multi-pole structure to make it possible act as a deflector or additionally a stigmator. In FIG. 2, the 2nd electrode 254 has a multi-pole structure and is named as No. 2 Electrostatic Multi-pole Lens. It and No. 1 electrostatic multi-pole lens 232 act as deflectors to together deflect the primary electron beam 202 for the scanning on the specimen 270. This in-lens-field deflection generates smaller off-axis aberrations. Here, the 2nd electrode 254 can additionally act as a stigmator to compensate the astigmatism due to the imperfect manufacturing of the condenser 222 and the electromagnetic compound objective 230.

Figure 8:
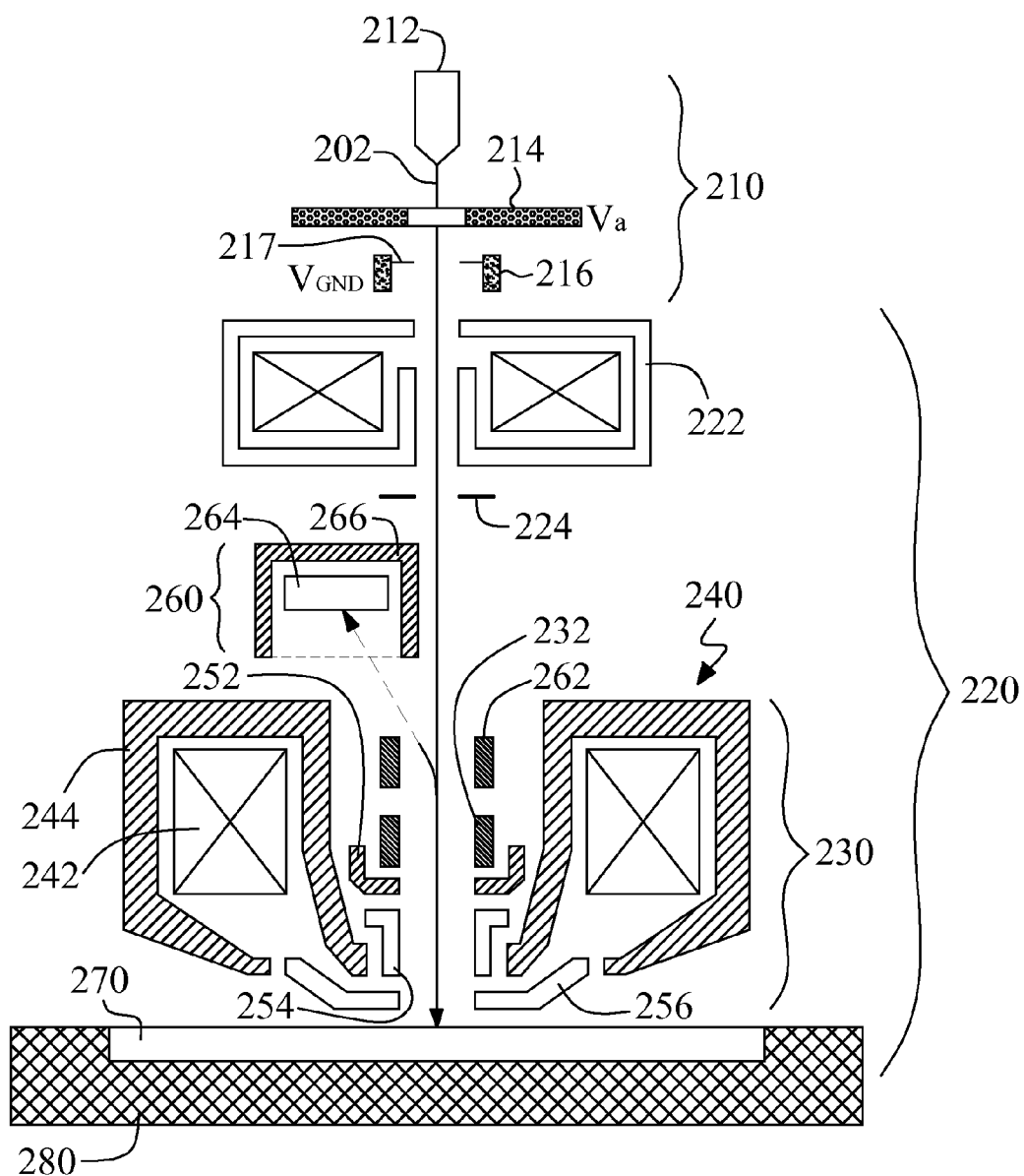
FIG. 8 is a schematic illustration of a particle beam apparatus in accordance with a second embodiment of the present invention.

In FIG. 8, the 1st electrode 252 of the electrostatic immersion lens 250 has a multi-pole structure and is named as No. 2 electrostatic multi-pole Lens. It and No. 1 electrostatic multi-pole lens 232 act as deflectors to together deflect the primary electron beam 202 for the scanning on the specimen 270. This close-to-lens-field deflection also generates smaller off-axis aberrations. Here, the 1st electrode 252 can additionally act as a stigmator to compensate the astigmatism due to the imperfect manufacturing of the condenser 222 and the electromagnetic compound objective lens 230.

Figure 9:
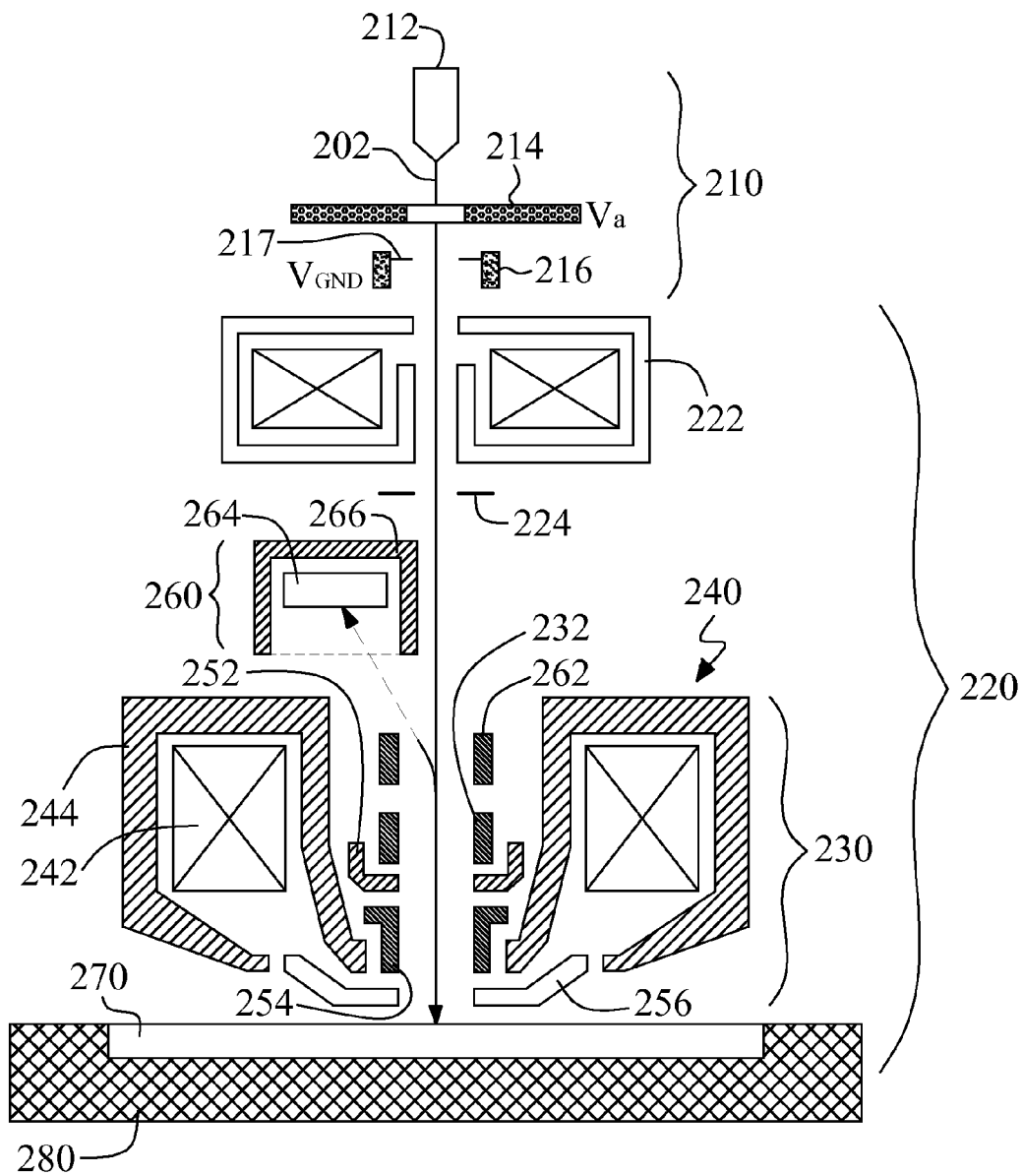
FIG. 9 is a schematic illustration of a particle beam apparatus in accordance with a third embodiment of the present invention.

In FIG. 9, both of the 1st 252 and 2nd 254 electrodes of the electrostatic immersion lens 250 have a multi-pole structure and are named as No. 2 and No. 3 electrostatic multi-pole Lenses respectively. One of them and No. 1 electrostatic multi-pole lens 232 act as deflectors to together deflect the primary electron beam 202 for the scanning on the specimen 270, and another acts as a stigmator to compensate the astigmatism due to the imperfect manufacturing of the condenser 222 and the electromagnetic compound objective lens 230.

In this invention, a magnetic immersion objective lens with a magnetic specimen stage is provided. Hence, a lower coil excitation is needed to generate a magnetic field as strong as conventional magnetic immersion objective lens. With a design of a plurality of electrodes in an electrostatic immersion objective lens, not only a retarding field is provided, but also the aberrations of the magnetic immersion objective lens are compensated to a great degree even when the specimen is biased at a smaller negative voltage relative to the column potential. Further, because the electrostatic immersion objective lens screens the specimen from the inner pole piece, a smaller working distance of the magnetic immersion objective lens can be used. This makes the aberrations of the magnetic immersion objective lens become further small. Moreover, all of these advantages make it possible to generate a smaller probe spot size without reducing the probe current, which can finally increase the throughput of defect inspection and review systems to a certain degree.

Although the present invention has been explained in relation to its preferred embodiments, it is to be understood that other modifications and variation can be made without departing the spirit and scope of the invention as hereafter claimed.

What is claimed is:

1. An electromagnetic compound objective lens, comprising:
    a magnetic immersion lens including an inner pole piece and an outer pole piece, wherein the inner pole piece and the outer pole piece form a radial magnetic circuit gap facing to a surface of a specimen; and
    an electrostatic immersion lens for electrically screening the magnetic immersion lens from the specimen, and providing a retarding field to the primary beam.

2. The electromagnetic compound objective lens according to claim 1, wherein the magnetic immersion lens comprises a stage for mounting the specimen, the stage being made of a magnetic material, such that a peak of a magnetic field is located at the surface of the specimen.

3. The electromagnetic compound objective lens according to claim 1, wherein the inner pole piece has a first axial distance to the specimen shorter than the outer pole piece.

4. The electromagnetic compound objective lens according to claim 3, wherein the inner pole piece has a cylinder surface facing to the primary beam.

5. The electromagnetic compound objective lens according to claim 4, wherein the electrostatic immersion lens comprises:
    a first electrode inside the inner pole piece;
    a second electrode under the first electrode and inside the inner pole piece;
    a third electrode under the second electrode and the inner pole piece of magnetic immersion lens; and
    a fourth electrode under the third electrode and being the specimen.

6. The electromagnetic compound objective lens according to claim 5, wherein the first electrode, the second electrode, and the third electrode are round electrodes.

7. The electromagnetic compound objective lens according to claim 6, wherein the first electrode is at ground potential.

8. The electromagnetic compound objective lens according to claim 7, wherein the fourth electrode is at negative potential to obtain 0.2 keV~2.5 keV electron landing energy on specimen.

9. The electromagnetic compound objective lens according to claim 5, wherein the second electrode screens the inner pole piece from the primary beam.

10. The electromagnetic compound objective lens according to claim 9, wherein the second electrode covers the inner pole piece from inside with a first radial gap, and has a second axial distance equal or shorter than the first axial distance.

11. The electromagnetic compound objective lens according to claim 10, wherein the second electrode is at a potential higher than the third electrode potential.

12. The electromagnetic compound objective lens according to claim 5, wherein the third electrode screens the inner pole piece from the specimen.

13. The electromagnetic compound objective lens according to claim 12, wherein the third electrode has a flat inner part with an inner diameter equal or smaller than the inner diameter of the inner pole piece, and a conical outer part inlaying to the radial magnetic circuit gap.

14. The electromagnetic compound objective lens according to claim 13, wherein the third electrode is at a potential higher than the fourth electrode, and the potential difference between the third electrode and the fourth electrode is set to ensure the electric field strength over the entire specimen weaker than a permissible value for the specimen safety.

15. The electromagnetic compound objective lens according to claim 5, wherein the first electrode has a multi-pole structure and acts as a deflector.

16. The electromagnetic compound objective lens according to claim 5, wherein the first electrode has a multi-pole structure and acts as a deflector and a stigmator.

17. The electromagnetic compound objective lens according to claim 5, wherein the second electrode has a multi-pole structure and acts as a deflector.

18. The electromagnetic compound objective lens according to claim 5, wherein the second electrode has a multi-pole structure and acts as a deflector and a stigmator.

19. The electromagnetic compound objective lens according to claim 5, wherein the first electrode and the second electrode have a multi-pole structure, and one of the first electrode and the second electrode acts as a deflector and the other acts as a stigmator.

20. A low-voltage scanning electron microscope, comprising:
    an electron gun for providing a primary electron beam, the electron gun including a cathode, an anode, a terminal electrode and a gun aperture;
    a column for focusing and scanning the primary electron beam on a specimen surface, the column including:
        a condenser for condensing the primary electron beam;
        a beam limit aperture limiting the current of the primary electron beam;
        a Wien filter;
        two electrostatic deflectors for deflecting scanning the primary electron beam; and
        an electromagnetic compound objective lens according to claim 5 for focusing the primary beam onto the specimen;
    an off-axis detector for receiving a secondary electron beam which is emitted from the specimen and deflected away from the optical axis by the Wien filter.

21. The low-voltage scanning electron microscope according to claim 20, wherein the gun aperture is a terminal electrode.

22. The low-voltage scanning electron microscope according to claim 20, wherein a potential arrangement is:
    the cathode at about a fixed potential within −12 kV to −4 kV;
    the terminal electrode at ground potential;
    a potential difference between the cathode and the anode being set to generate a virtue source with a desired high brightness;

the condenser, and the magnetic immersion lens at ground potential;

the first electrode at ground potential;

the second electrode at a potential higher than the third electrode voltage;

the third electrode at a potential higher than the fourth electrode; and the fourth electrode at a potential which is 0.2 kV~2.5 kV higher than the cathode potential.

23. The electromagnetic compound objective lens according to claim 4, wherein the electrostatic immersion lens comprises:

a first electrode inside the inner pole piece;

a second electrode under the first electrode and the inner pole piece of magnetic immersion lens; and a third electrode under the second electrode and being the specimen.

* * * * *